(12) United States Patent
Hatipoglu et al.

(10) Patent No.: US 11,595,758 B2
(45) Date of Patent: Feb. 28, 2023

(54) MEMS SPEAKER

(71) Applicant: Apple Inc., Cupertino, CA (US)

(72) Inventors: Gokhan Hatipoglu, Santa Clara, CA (US); Onur I. Ilkorur, Campbell, CA (US); Pablo Seoane Vieites, San Jose, CA (US); Christopher Wilk, Los Gatos, CA (US); Peter C. Hrudey, San Mateo, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/177,178

(22) Filed: Feb. 16, 2021

(65) Prior Publication Data

US 2022/0014853 A1  Jan. 13, 2022

Related U.S. Application Data

(60) Provisional application No. 63/050,054, filed on Jul. 9, 2020.

(51) Int. Cl.
*H04R 7/14* (2006.01)
*H04R 19/02* (2006.01)
*B81B 3/00* (2006.01)

(52) U.S. Cl.
CPC .............. *H04R 7/14* (2013.01); *B81B 3/0021* (2013.01); *H04R 19/02* (2013.01)

(58) Field of Classification Search
CPC ........ B81B 3/0021; H04R 7/14; H04R 19/02; H04R 1/021; H04R 2201/003; H04R 2499/11; H04R 19/013
See application file for complete search history.

(56) References Cited

U.S. PATENT DOCUMENTS

| | | | |
|---|---|---|---|
| 3,636,278 A | 1/1972 | Heil | |
| 9,584,941 B2* | 2/2017 | Dehe | H04R 1/005 |
| 10,111,021 B2* | 10/2018 | Deas | H04R 19/005 |
| 10,442,683 B2 | 10/2019 | Saxena | |
| 10,667,038 B2 | 5/2020 | Agshe et al. | |

(Continued)

FOREIGN PATENT DOCUMENTS

| | | |
|---|---|---|
| EP | 2758335 | 7/2014 |
| EP | 3143778 B1 | 6/2021 |

OTHER PUBLICATIONS

Tymphany LAT 700 Subwoofer, specification sheet, 2009, retrieved from https://www.tymphany.com/wp-content/uploads/2018/10/Discontinued-Tymphany-LAT-Products-LAT700-001.pdf, 2 pages.

(Continued)

*Primary Examiner* — Brian Ensey
(74) *Attorney, Agent, or Firm* — BakerHostetler

(57) ABSTRACT

A MEMS speaker can include an electrostatically driven, corrugated MEMS structure to move air without a magnet, coil, or traditional speaker membrane, and thus provide a low-power, compact speaker with a large acoustically active area in a small volume. Neighboring folds in the corrugated MEMS structure may form pairs of MEMS electrodes that can be pushed together and/or pulled apart to deform the MEMS structure in a breathing motion that generates pressure differentials on opposing sides of the corrugated MEMS structure to generate sound.

32 Claims, 11 Drawing Sheets

(56) References Cited

U.S. PATENT DOCUMENTS

2014/0247955 A1* 9/2014 Nystrom ............... H04R 19/02
                                                            381/150
2017/0041717 A1   2/2017 Zou
2020/0178000 A1   6/2020 Niekiel et al.

OTHER PUBLICATIONS

"New Eminence Speakers for 2014," Voice Coil, 2014, retrieved from http://www.bzspeakers.com/pd_data/Bozhen_DDQ_VC_2014_7.pdf, 3 pages.

Kaiser, et al., "Concept and proof for an all-silicon MEMS micro speaker utilizing air chambers", *Microsyst Nanoeng*, 2019; 5:43. Published Oct. 7, 2019. doi:10.1038/s41378-019-0095-9.

Indian Office Action from Indian Patent Application No. 202114029829, dated Mar. 16, 2022, 6 pages.

\* cited by examiner

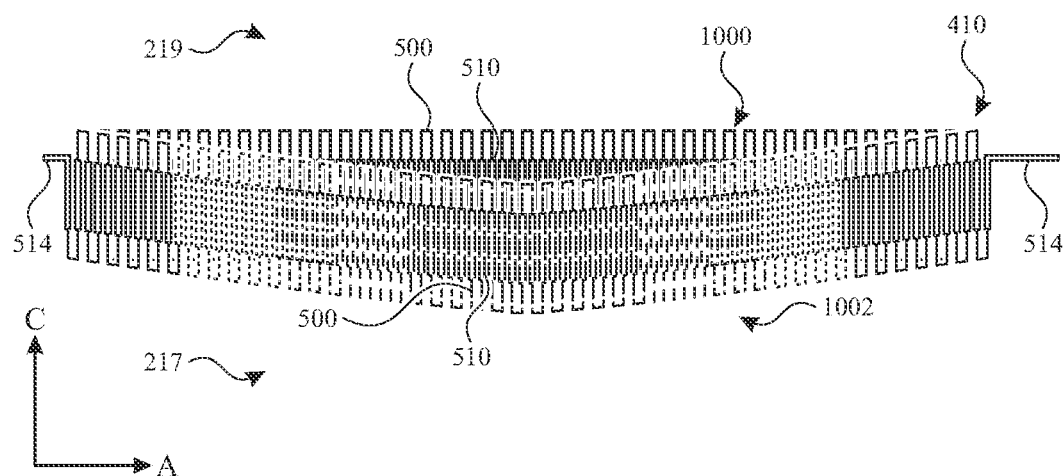
FIG. 10
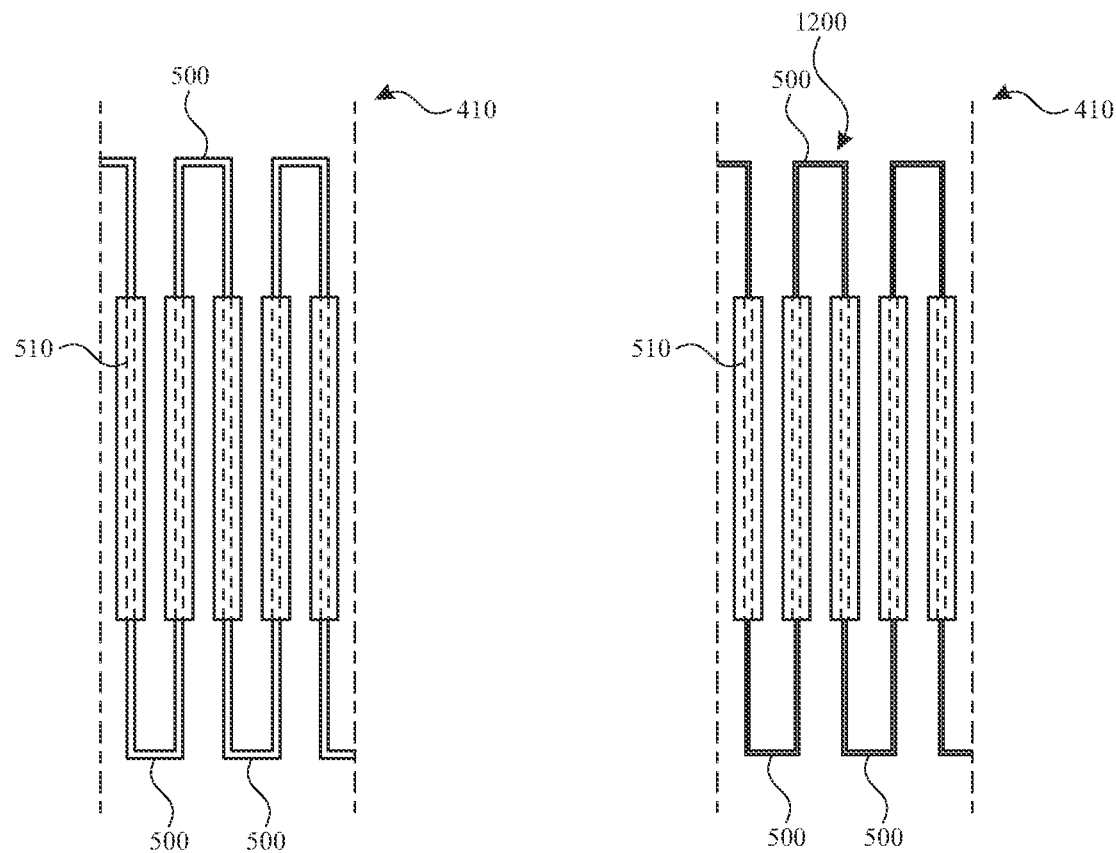
FIG. 11
FIG. 12

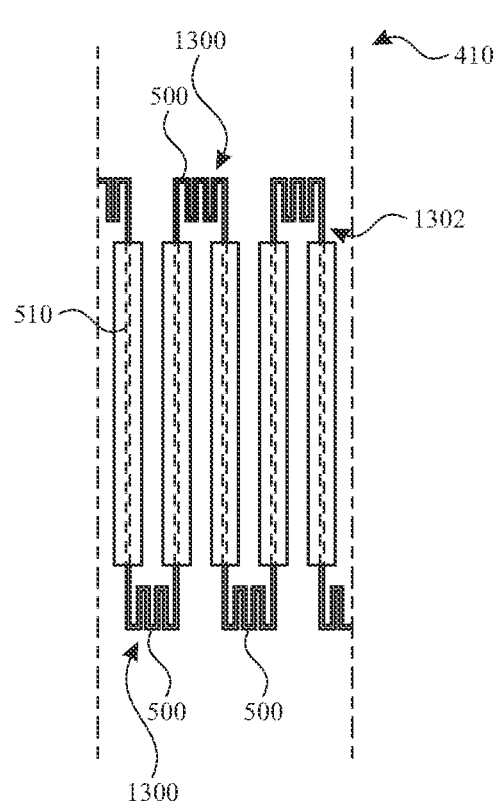
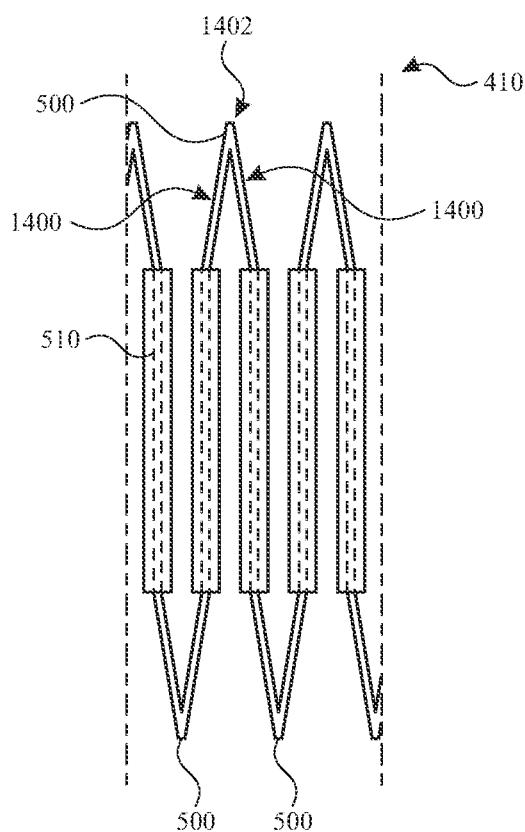
FIG. 13     FIG. 14
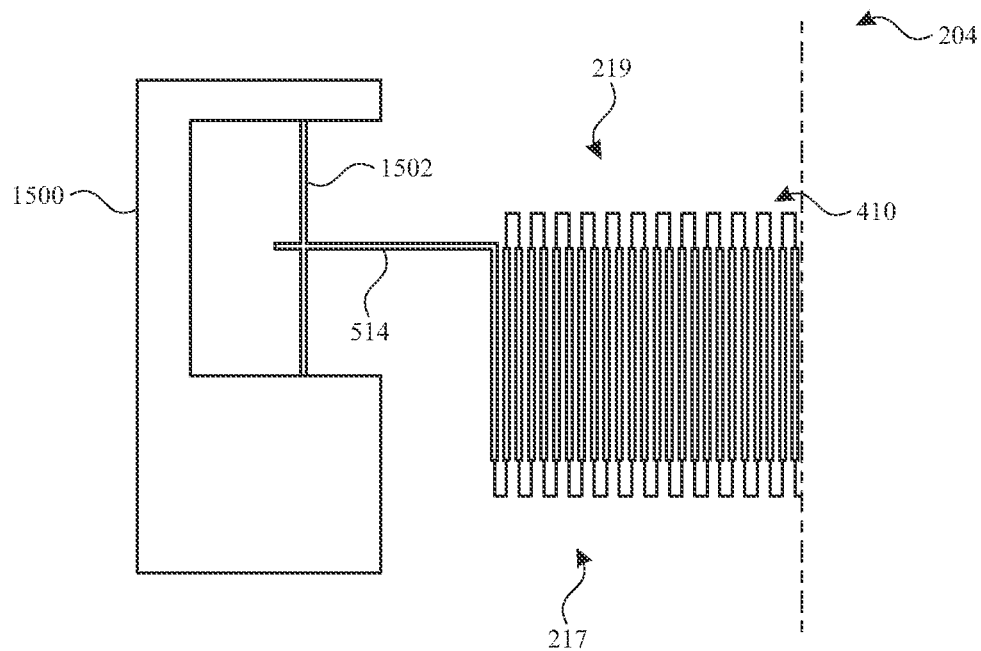
FIG. 15

US 11,595,758 B2

MEMS SPEAKER

CROSS REFERENCE TO RELATED APPLICATIONS

This application claims the benefit of priority to U.S. Provisional Patent Application No. 63/050,054, entitled "MEMS Speaker," filed on Jul. 9, 2020, the disclosure of which is hereby incorporated herein in its entirety.

TECHNICAL FIELD

The present description relates generally to electronic devices, and more particularly, but not exclusively, microelectromechanical systems (MEMS) speakers.

BACKGROUND

Electronic devices such as computers, media players, cellular telephones, wearable devices, and headphones are often provided with speakers for generating sound output from the device. However, particularly as devices are implemented in ever smaller form factors, and as user demand for high quality audio increases, it can be challenging to provide speakers that generate high quality sound, particularly in compact devices such as portable electronic devices.

BRIEF DESCRIPTION OF THE DRAWINGS

Certain features of the subject technology are set forth in the appended claims. However, for purpose of explanation, several embodiments of the subject technology are set forth in the following figures.

FIG. 10 illustrates a side view of an example MEMS structure of a MEMS speaker arranged for out-of-plane motion in accordance with various aspects of the subject technology.

FIG. 11 illustrates a cross-sectional side view of a portion of another example MEMS structure of a MEMS speaker in accordance with various aspects of the subject technology.

FIG. 12 illustrates a cross-sectional side view of a portion of another example MEMS structure of a MEMS speaker having thinned folds in accordance with various aspects of the subject technology.

FIG. 13 illustrates a cross-sectional side view of a portion of another example MEMS structure of a MEMS speaker having corrugated folds in accordance with various aspects of the subject technology.

FIG. 14 illustrates a cross-sectional side view of a portion of another example MEMS structure of a MEMS speaker having tented folds in accordance with various aspects of the subject technology.

FIG. 15 illustrates a cross-sectional side view of a portion of a MEMS speaker having a MEMS structure with a fixed, but compliant edge in accordance with various aspects of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Portable electronic devices such as a mobile phones, portable music players, smart watches, tablet computers, laptop computers, other wearable devices, headphones, earbuds, and the like often include a speaker for generating sound.

In accordance with various aspects of the subject disclosure, a low-power, compact speaker is provided that includes an electrostatically driven, corrugated MEMS structure to move air without a magnet, coil, or traditional speaker membrane. The speaker, which is referred to herein variously as a MEMS speaker or a micro-speaker, is implemented with corrugations in the MEMS structure that provide a large acoustically active area in a small volume. Neighboring corrugations in the corrugated MEMS structure may form pairs of MEMS electrodes that can be pushed together and/or pulled apart (e.g., in a breathing motion that generates pressure differentials above and below the corrugated MEMS structure) to generate sound. The speaker can include multiple corrugated MEMS structures that are operated in pairs. One or more corrugated MEMS structures can be mounted between a front volume and a back volume of the speaker. In one or more implementations, one or more corrugated MEMS structures can be mounted between top and bottom substrates with openings to allow airflow to and from the corrugated MEMS structure. In one or more implementations, multiple layers of corrugated MEMS structures can be stacked.

In one or more implementations, wide and/or varied spacing between the MEMS electrodes can be provided to tune the corrugated MEMS structure to low and/or varied frequencies. In these implementations, posts on the top and/or bottom substrates can extend toward the corrugated MEMS structure to provide fixed (e.g., additional) electrodes for controlling the motion of the MEMS electrodes.

Figure 1:
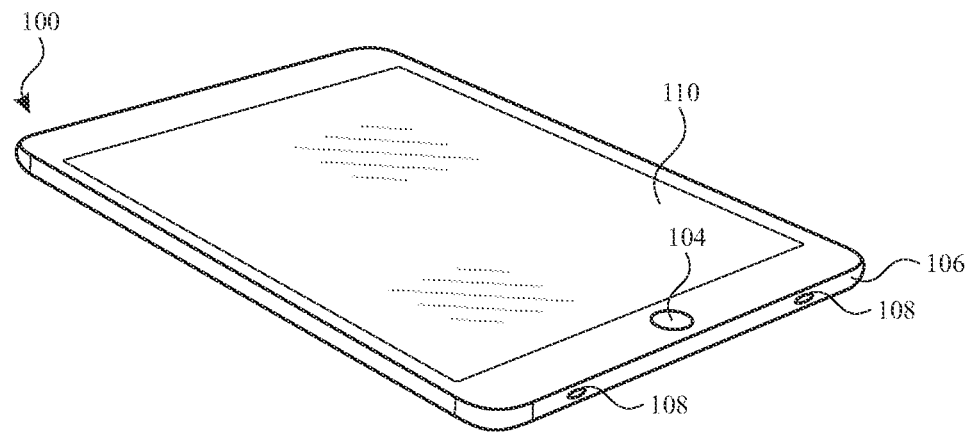
FIG. 1 illustrates a perspective view of an example electronic device having a MEMS speaker in accordance with various aspects of the subject technology.

An illustrative electronic device including a speaker is shown in FIG. 1. In the example of FIG. 1, device 100 (e.g., an electronic device) has been implemented using a housing that is sufficiently small to be portable and carried by a user (e.g., device 100 of FIG. 1 may be a handheld electronic device such as a tablet computer or a cellular telephone or smart phone). As shown in FIG. 1, device 100 includes a display such as display 110 mounted on the front of housing 106. Device 100 includes one or more input/output devices such as a touch screen incorporated into display 110, a button or switch such as button 104 and/or other input output components disposed on or behind display 110 or on or behind other portions of housing 106. Display 110 and/or housing 106 include one or more openings to accommodate button 104, a speaker, a light source, or a camera.

In the example of FIG. 1, housing 106 includes two openings 108 on a bottom sidewall of housing. One or more of openings 108 forms a port for an audio component. For example, one of openings 108 may form a speaker port for a speaker disposed within housing 106 and another one of openings 108 may form a microphone port for a microphone disposed within housing 106. Openings 108 may be open ports or may be completely or partially covered with a permeable membrane or a mesh structure that allows air and sound to pass through the openings. Although two openings 108 are shown in FIG. 1, this is merely illustrative. One opening 108, two openings 108, or more than two openings 108 may be provided on the bottom sidewall (as shown) on another sidewall (e.g., a top, left, or right sidewall), on a rear surface of housing 106 and/or a front surface of housing 106 or display 110. In some implementations, one or more groups of openings 108 in housing 106 may be aligned with a single port of an audio component within housing 106. Housing 106, which may sometimes be referred to as a case, may be formed of plastic, glass, ceramics, fiber composites, metal (e.g., stainless steel, aluminum, etc.), other suitable materials, or a combination of any two or more of these materials.

The configuration of device 100 of FIG. 1 is merely illustrative. In other implementations, device 100 may be a computer such as a computer that is integrated into a display such as a computer monitor, a laptop computer, a smaller portable device such as a smart watch, a pendant device, or other wearable or miniature device, a media player, a gaming device, a navigation device, a computer monitor, a television, a headphone, an earbud, or other electronic equipment. In some implementations, device 100 may be provided in the form of a computer integrated into a computer monitor. Display 110 may be mounted on a front surface of housing 106 and a stand may be provided to support housing (e.g., on a desktop).

In some implementations, device 100 may be provided in the form of a wearable device such as a smart watch. In one or more implementations, housing 106 may include one or more interfaces for mechanically coupling housing 106 to a strap or other structure for securing housing 106 to a wearer. It should be appreciated that, although device 100 includes one opening in the example of FIG. 1, device 100 may include one, two, three, four, or more than four openings. Device 100 may include one, two, three, or more than three audio components each mounted adjacent to one or more of openings 108.

A speaker disposed within housing 106 transmits sound through at least one associated opening 108. A microphone may also be provided within housing 106 that receives sound through at least one associated opening in the housing. In one or more implementations, the speaker may be implemented as a microelectromechanical systems (MEMS) speaker.

Figure 2:
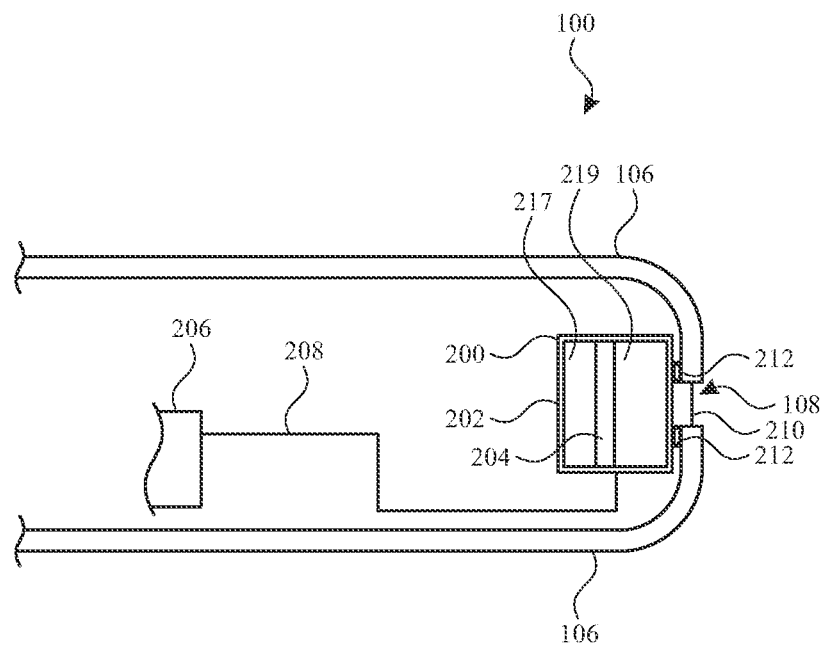
FIG. 2 illustrates a cross-sectional side view of a portion of an example electronic device having a MEMS speaker in accordance with various aspects of the subject technology.

FIG. 2 illustrates a cross-sectional view of a portion of device 100 in which an audio component is mounted. In the example of FIG. 2, device 100 includes speaker 200. Speaker 200 includes speaker housing 202 mounted adjacent at least one opening 108 in housing 106. Speaker housing 202 may be formed form one or more materials such as plastic or metal. As shown, speaker 200 may include a MEMS component 204 disposed within the speaker housing 202. As shown in FIG. 2, the MEMS component 204 may be mounted between a back volume 217 and a front volume 219 (e.g., as defined by the speaker housing 202 and/or one or more portions of the device housing 106). As illustrated in FIG. 2, speaker housing 202 may include an opening that is aligned with opening 108 in housing 106 so that sound generated by MEMS component 204 (e.g., responsive to control signals received from device circuitry 206) can be transmitted through the opening 108 to the external environment. Opening 108 may be an open port or may include a cover 210 such as a membrane or a mesh structure that discourages entry of liquid into speaker housing 202, but that is permeable to sound and air.

MEMS component 204 may be coupled to device circuitry such as device circuitry 206 (e.g., one or more processors of the device) via a connector 208. Connector 208 may include a flexible integrated circuit or another flexible or rigid conductive connector. In one or more implementations, connector 208 may electrically couple to one or more contacts on speaker housing 202 that are electrically coupled (e.g., via wire bonds or other conductive connections) to MEMS component 204. However, it should be appreciated that, in one or more implementations, MEMS component 204 may be provided without a separate speaker housing 202 (e.g., and coupled directly to connector 208 and/or device circuitry 206). In implementations in which MEMS component 204 is provided without a separate speaker housing, an outer layer of the MEMS component 204 can be attached to an inner surface of housing 106 (e.g., by adhesive 212 or another coupling mechanism), mounted to a printed circuit within device 100, or otherwise mounted within housing 106 so as to project sound out of housing 106 through opening 108.

Figure 3:
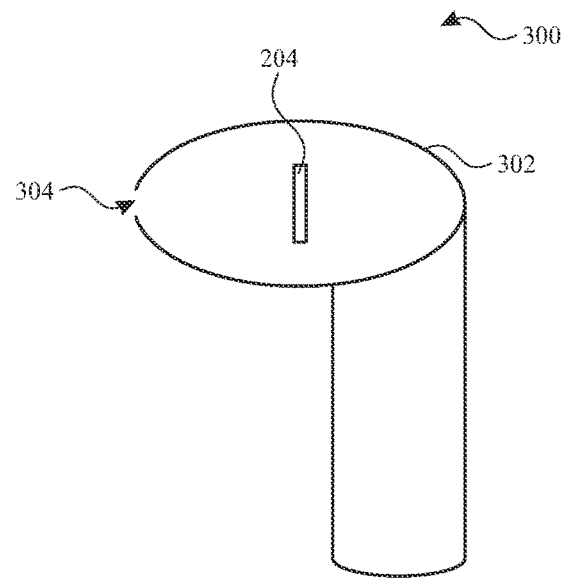
FIG. 3 illustrates a perspective view of another example electronic device having a MEMS speaker in accordance with various aspects of the subject technology.

FIG. 3 illustrates another example electronic that may include a MEMS speaker. In the example of FIG. 3, a device 300 is implemented as an earbud having a MEMS speaker formed by a MEMS component 204. As shown, device 300 may include a housing 302 having a shape that is configured to fill the opening of an ear canal of a user wearing the earbud. Device 300 may include one or more openings, such as an opening 304 in the housing 302. Housing 302 may have a size and a shape that conforms to a portion of an outer ear, such that opening 304 may be aligned with the ear canal of the user when the earbud is worn by the user, to allow sound generated by MEMS component 204 to enter the user's ear canal. Device 300 may be a wired or wireless earbud that communicates with a companion device such as device 100 of FIG. 1 to receive instructions and/or signals to operate the MEMS speaker corresponding to MEMS component 204 to generate sound. The housing 302 of device 300, and/or a speaker housing within the housing 302 can form (e.g., define) a back volume and a front volume for the MEMS component 204.

The electronic devices of FIGS. 1 and 3 are merely illustrative, and it should be appreciated that a MEMS speaker as described herein can be implemented in any suitable electronic device for which it is desired to generate high quality sound from within a small volume.

Figure 4:
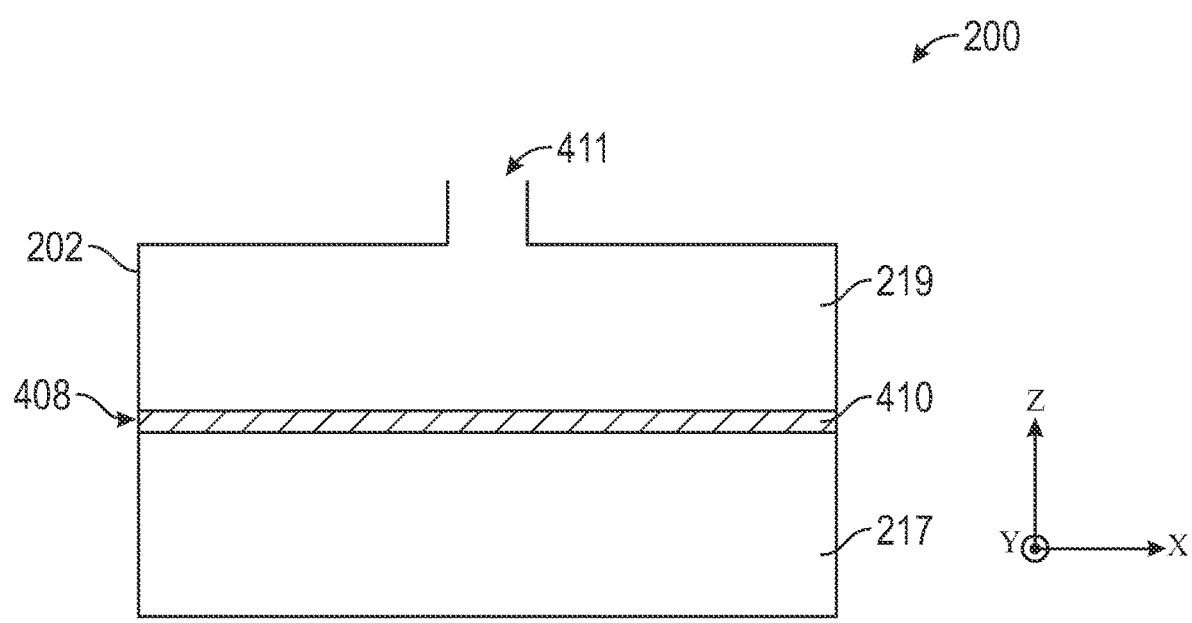
FIG. 4 illustrates a schematic cross-sectional side view of an example MEMS speaker in accordance with various aspects of the subject technology.

FIG. 4 shows an example of a portion of a speaker for an electronic device, in an implementation in which a MEMS actuator (or transducer) is implemented as a MEMS speaker. In the example of FIG. 4, speaker 200 includes a MEMS structure 410 that form a MEMS layer 408 between back volume 217 and front volume 219. FIG. 4 illustrates an arrangement in which the MEMS structure 410 is disposed in a plane defined by x and y directions, with the front and back volumes disposed on opposing sides of the MEMS structure 410 in a z direction. However, this arrangement is merely illustrative and other arrangements are contemplated and described herein. As described in further detail herein, speaker 200 may be operated by applying a voltage to a MEMS structure 410, such as a corrugated microelectromechanical systems (MEMS), that is disposed between the front volume 219 and the back volume 217, where applying the voltage causes deforming, by the applied voltage, of the corrugated MEMS structure to generate sound with the speaker. The sound that is generated may pass through an opening 411 in a speaker housing and/or through one or more openings in a device housing to provide sound for an electronic device, such as for one of the electronic devices 100 and 300 of FIGS. 1 and 3.

Figure 5:
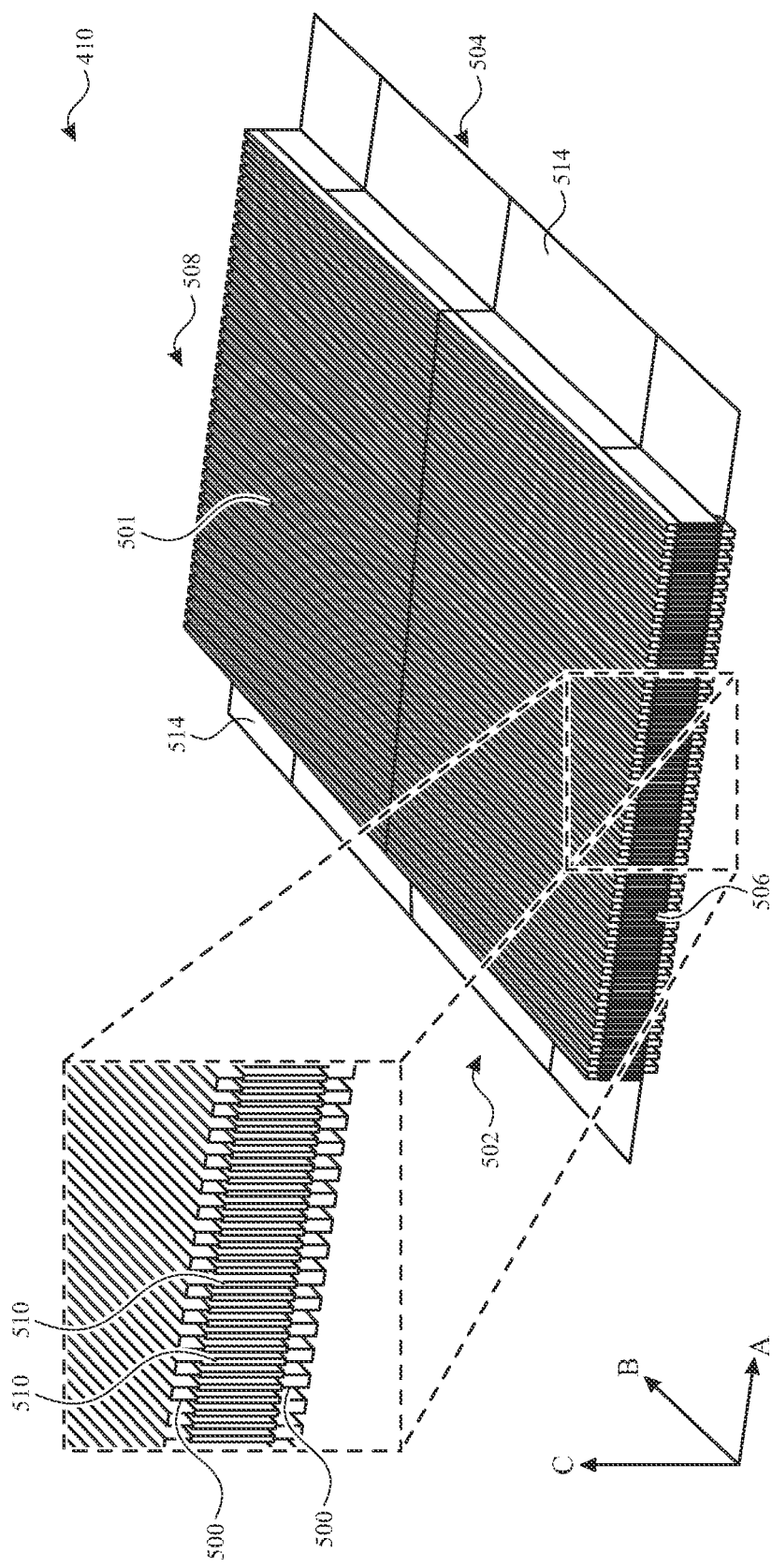
FIG. 5 illustrates a cross-sectional perspective view of a portion of an example MEMS structure of a MEMS speaker in accordance with various aspects of the subject technology.

FIG. 5 illustrates a perspective view of a MEMS structure 410 in accordance with one or more implementations. In the example of FIG. 5, MEMS structure 410 is formed from a single contiguous structure 501 that extends, in a first dimension (e.g., the A dimension in FIG. 5), from a first edge 502 to a second edge 504, and includes multiple alternating folds 500 disposed between the first edge 502 and the second edge 504. The single contiguous structure 501 may be formed using MEMS manufacturing methods (e.g., deposition, etching, lithography, patterning, dicing, etc., which allows the MEMS components 204 to be mass manufacturable) to form a corrugated MEMS structure defined by the alternating folds 500 as shown. As shown, MEMS structure 410 has deep corrugated structures placed in close proximity with good tolerance. The micro-scale of MEMS structure 410 enables dense packing of the corrugations (which can provide advantages in terms of large surface area of the actuator per total die area). As shown, the single contiguous structure 501 may include tabs 514 that run along the edges 502 and 504. Tabs 514 may be mounted to or disposed within a support structure or housing structure for MEMS component 204 in various ways, as discussed in further detail hereinafter (e.g., in connection with FIGS. 15-17).

As shown in FIG. 5, the corrugated MEMS structure may include MEMS electrodes 510, each forming a part of the single contiguous structure 501, the part extending in a second dimension (e.g., the C dimension of FIG. 5) perpendicular to the first dimension, between a corresponding pair of the alternating folds 500. The alternating folds 500 may include upper folds extending from a first side of the MEMS electrodes 510 and between two adjacent MEMS electrodes 510, and lower folds extending from an opposing second end of the MEMS electrodes 510 and between two adjacent MEMS electrodes 510. The single contiguous structure 501 also extends, in a third dimension (e.g., the B dimension of FIG. 5) perpendicular to the first dimension and the second dimension, from a first end 506 to a second end 508. The corrugations in the corrugated MEMS structure of FIG. 5 (e.g., each corrugation including an upper fold 500, a lower fold 500, and an intervening MEMS electrode 510) provide an efficient die area to SD ratio (e.g., a large acoustically active area in a small volume).

In various implementations of MEMS component 204, the A, B, and C dimensions of the MEMS structure of FIG. 5 can be aligned with the x, y, and z directions of FIG. 4, the B, A, and C dimensions of FIG. 5 can be aligned with the x, y, and z directions of FIG. 4, or the C, A, and B dimensions of FIG. 5 can be aligned with the x, y, and z directions of FIG. 4 (as examples).

Figure 6:
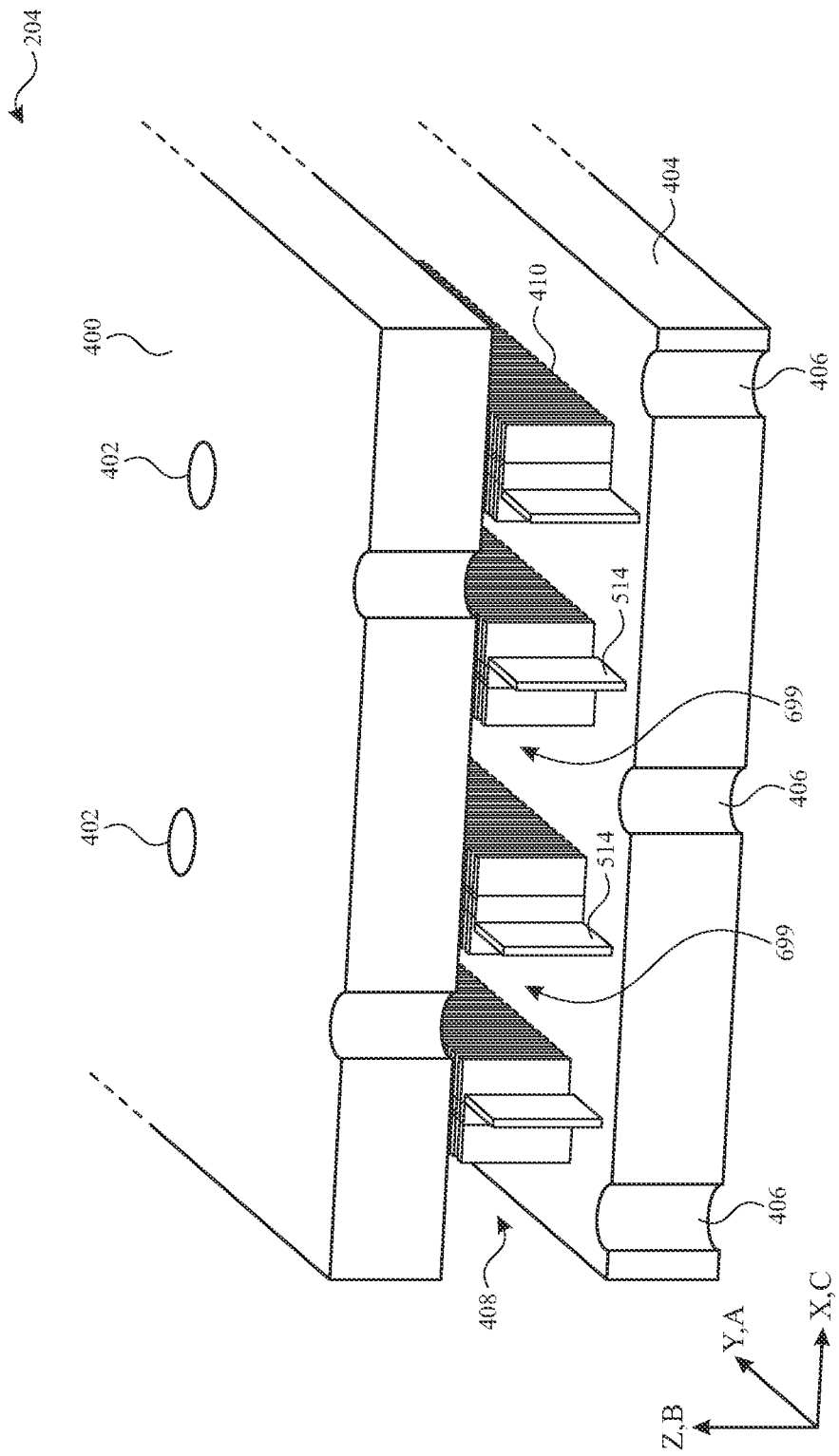
FIG. 6 illustrates a perspective view of an exemplary implementation of a portion of a MEMS speaker implemented with first and second substrates with openings in accordance with various aspects of the subject technology.
Figure 7:
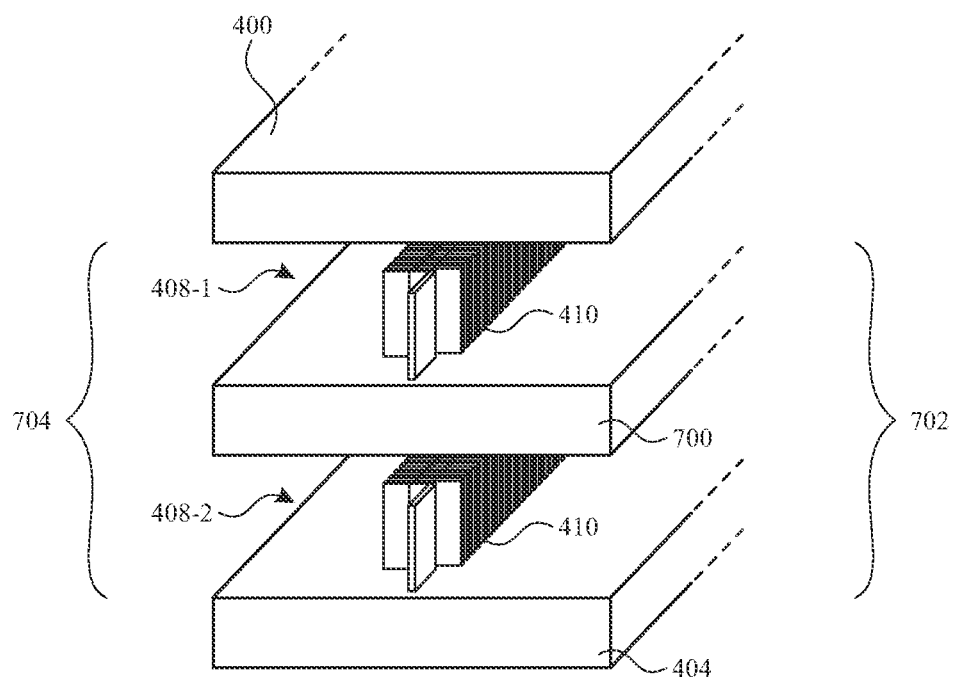
FIG. 7 illustrates a cross-sectional side view of a portion of an example MEMS speaker having multiple MEMS layers in accordance with various aspects of the subject technology.

In one or more implementations, a MEMS component 204 can include one or more MEMS structures 410 and that are mounted between substrates. FIGS. 6 and 7 illustrate examples in which MEMS structures 410 are disposed between substrates of a MEMS component. However, it should be appreciated that the examples of FIGS. 6 and 7 are illustrative and that implementations of a MEMS component of a MEMS speaker that do not include substrates disposed on opposing sides of the MEMS component are also disclosed. For example, the MEMS component 410 of FIG. 5 and/or in any of the examples of FIG. 7-17 or 21 can be provided with or without substrates such as the substrates described in connection with FIGS. 6 and 7.

In the example of FIG. 6, an example of a MEMS component 204 is shown that includes a first substrate 400 having a first set of openings 402, a second substrate 404 having a second set of openings 406 that are misaligned with the first set of openings, and a microelectromechanical systems (MEMS) structure 410 disposed between the first substrate 400 and the second substrate 404. In this example in which substrates 400 and 404 are provided, the back volume 217 and the front volume 219 of FIGS. 2 and 4 may be disposed outside the openings 402 and 406, respectively. As shown in the example of FIG. 6, the first set of openings 402 may include multiple rows of openings, each row spaced apart along the y-direction of FIG. 4. Although not visible in the perspective view of FIG. 6, the second set of openings 406 may also include rows of openings spaced apart in the y-direction of FIG. 4.

As shown, MEMS component 204 may include multiple MEMS structures 410 that form a MEMS layer 408 between first substrate 400 and second substrate 404. In the example of FIG. 6, MEMS layer 408 includes a MEMS structure 410 having an elongate dimension that extends in a direction parallel to the rows of openings 402 and the rows of openings 406 (e.g., along the y-direction of FIG. 6). In the example of FIG. 6, one MEMS structure 410 is disposed at a location, in the x-direction of FIG. 6 (e.g., in a direction perpendicular to the directions along which the rows of openings 402 and 406 are spaced apart), between each row of openings 402 and an adjacent row of openings 406 in the second substrate 404. As shown in FIG. 6, MEMS component 204 may include multiple corrugated MEMS structures 410 disposed between the first substrate and the second substrate, where the multiple corrugated MEMS structures are misaligned with both the first plurality of openings 402 and the second plurality of openings 406.

Each MEMS structure 410 may be a corrugated MEMS structure, as described above in connection with, e.g., FIG. 5. As shown in the example of FIG. 6, a space 699 may be disposed between adjacent ones of the MEMS structures 410. In this example, the actuation of MEMS structures 410 can be coordinated to create pressure differentials in the spaces 699 between the actuators. The pressure differences generated in the spaces 699 between the actuators, cause air to be pushed towards or pulled through the openings 402 and 406 to generate pressure differentials in the front and back volumes of the speaker. In one or more implementations, small spaces may be provided between the MEMS structures 410 and the first and second substrates 400 and 404, to act as acoustic seals to avoid the pressure differentials in spaces 699 from escaping to the neighboring space 699. Corrugations in the MEMS structures 410 can be arranged along the x-direction or the y-direction of FIG. 4 in various implementations.

In the example of FIG. 6, the corrugated MEMS structures (e.g., MEMS structures 410) are spaced apart in a direction parallel to the second dimension (e.g., the C dimension) of the MEMS structures. In the example of FIG. 6 in which MEMS structures 410 are disposed between first and second substrates 400 and 404, the C, A, and B dimensions of FIG. 5 are aligned with the x, y, and z directions.

In the example of FIG. 6, the corrugated MEMS structures (e.g., MEMS structures 410) are spaced apart in a direction parallel to the x-direction of FIG. 4 (e.g., a direction parallel to the planes of the first and second substrates 400 and 404 and perpendicular to the direction in which the rows of openings are aligned in the substrates). In this example, the MEMS electrodes 510 of each MEMS structure 410 can be actuated by an application of an electrical input (e.g., an electrostatic input applied without using magnet and coil assemblies that are common in conventional speakers) to the electrodes, to generate various motions of the MEMS structure 410 to generate pressure differentials (e.g., in spaces 699) that pull and/or push air into and/or out of the openings 402 and 406.

In the example of FIG. 6, an exemplary implementation of MEMS component 204 is described in which a MEMS layer 408, including multiple MEMS structures 410, is provided between first and second substrates 404. However, it should also be appreciated that, in one or more implementations, multiple layers of corrugated MEMS structures can be stacked.

FIG. 7 illustrates an example in which MEMS component 204 includes a third substrate 700 disposed between the first substrate 400 and the second substrate 404. In the example of FIG. 7, a MEMS structure 410 (e.g., a corrugated MEMS structure as described above in connection with FIG. 5) is disposed (e.g., in a first MEMS layer 408-1) between the first substrate 400 and the third substrate 700, and an additional corrugated MEMS structure (e.g., an additional MEMS structure 410) is disposed (e.g., in a second MEMS layer 408-2) between the third substrate 700 and the second substrate 404. Each of the MEMS structures 410 shown in FIG. 7 can be arranged in the alignment described above in connection with FIGS. 5 and 6, and can be operated in any of the various motions or modes of operation described herein. In the example of FIG. 7, the MEMS structure(s) 410 of the first MEMS layer 408-1 are aligned with the MEMS structures 410 of the second MEMS layer 408-2 to create a back volume 702 (e.g., corresponding to the back volume 217 of FIGS. 2 and/or 4) on a first side of the MEMS structures 410 and a front volume 704 (e.g., corresponding to the front volume 219 of FIGS. 2 and/or 4) on an opposing second side of the MEMS structures 410.

In the example of FIG. 7, openings are not included in the substrates, as the MEMS actuators in this implementation can separate the front and back volumes. However it should be appreciated that each of the first substrate 400, the second substrate 404, and the third substrate 700 can be provided with openings that pass through from a first side of the substrate to a second side of the substrate to allow air to flow through the openings (e.g., responsive to the electrostatic actuation of the MEMS structures 410). For example, the third substrate 700 can include rows of openings that are aligned with the openings 402 in first substrate 400 and misaligned with the openings 406 in second substrate 404, rows of openings that are aligned with the openings 406 in second substrate 404 and misaligned with the openings 402 in first substrate 400, of rows of openings that are aligned with the openings 402 in first substrate 400 and aligned with the openings 406 in second substrate 404, in various implementations.

The various motions of the MEMS structures 410 (e.g., in implementations in which the MEMS structure(s) are provided with or without the substrates of the examples of FIGS. 6 and 7) can include breathing motions in which the various MEMS electrodes 510 are moved (e.g., out of phase) toward and away from each other along the A dimension, and out-of-plane motions in which the movements of the various MEMS electrodes 510 are coordinated to cause bulk out-of-plane motion of portions of the MEMS structure 410 (e.g., in a direction substantially parallel to the C dimension). The movements of the various MEMS electrodes 510 can be coordinated to cause breathing or bulk motion of portions of the MEMS structure 410 parallel to the first and second substrates 400 and 404 (e.g., in implementations in which first and second substrates are provided in the MEMS component). Mixed mode motions of the MEMS structures 410 can also be provided (e.g., achieved through a superposition of breathing and out-of-plane motions). Various operation modes for MEMS component 204 can be provided to generate a desired motion of the MEMS structures 410 using different boundary conditions for the MEMS structures and/or using different electrode pair assignments as described in further detail hereinafter. In this way, the MEMS structures 410 can be mounted in an arrangements that provide a low-power, compact speaker that includes an electrostatically driven, corrugated MEMS structure to move air without a magnet, coil, or traditional speaker membrane.

Each of the upper folds 500 or each of the lower folds 500 in the corrugated MEMS structure may resiliently couple together a pair of MEMS electrodes 510 that can be pushed together and/or pulled apart (e.g., in a breathing motion that generates pressure differentials above and below the corrugated MEMS structure) to generate sound. A MEMS speaker can include multiple corrugated MEMS structures such as MEMS structures 410 (e.g., that can also be operated in pairs). One or more corrugated MEMS structures can be mounted between front and back volumes (e.g., and/or between first and second substrates 400 and 404 with openings 402 and 406) to generate pressure differentials in the front and back volumes that generate sound.

Figure 8:
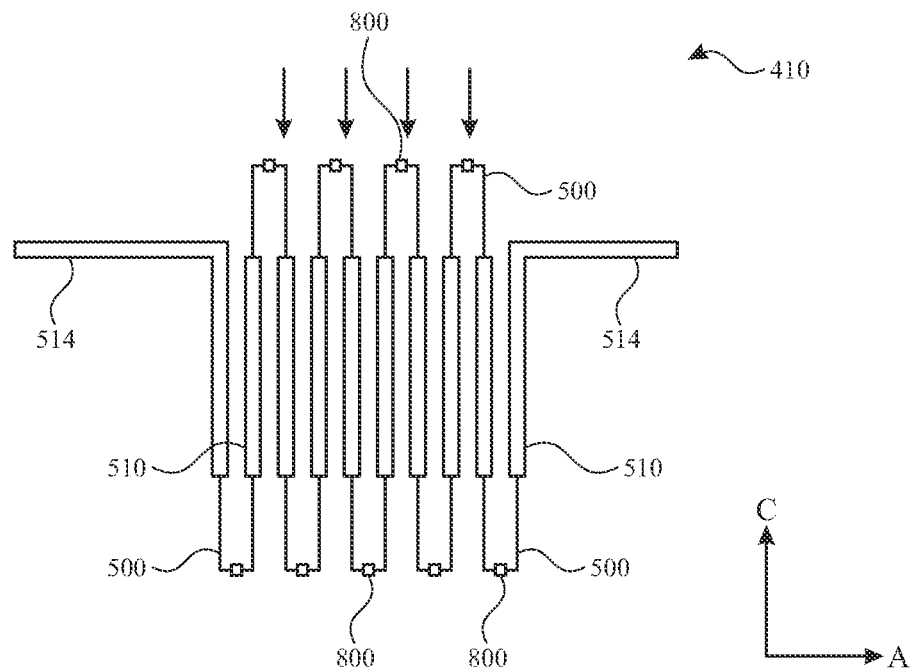
FIG. 8 illustrates a cross-sectional side view of an example MEMS structure of a MEMS speaker in accordance with various aspects of the subject technology.

FIG. 8 illustrates a cross-sectional side view of a MEMS structure 410, taken along a line parallel to the A dimension of FIG. 5. In the example of FIG. 5, MEMS electrodes 510 can be seen extending (e.g., in the C dimension) between adjacent folds 500 (e.g., between a corresponding upper fold and a corresponding lower fold). MEMS structure 410 may be formed from a semiconductor material (e.g., including silicon, silicon nitride, polymer, metal, ceramic, polysilicon, single crystal silicon, silicon nitride including softer materials such as Parylene, polyimide, and/or a composite of these and/or other materials). MEMS electrodes 510 may be formed from the same material as the MEMS structure 410 itself and/or may include additional or other materials (e.g., metals applied to the MEMS structure by electroplating, evaporation, and/or sputtering processes). As shown in FIG. 5, each fold 500 may include an insulating element 800 that electrically insulates adjacent MEMS electrodes 510 from each other. Insulating element may be formed from, for example, silicon dioxide or other insulating materials, and may be formed at the center of each fold as illustrated in FIG. 8 or elsewhere between MEMS electrodes 510. In the example of FIG. 8, MEMS structure 410 is shown without an applied electrostatic input, showing how MEMS electrodes 510 may be evenly spaced (e.g., by the resilient forces of folds 500) in a resting state (e.g., in which no voltage is applied to the MEMS electrodes 510).

Figure 9:
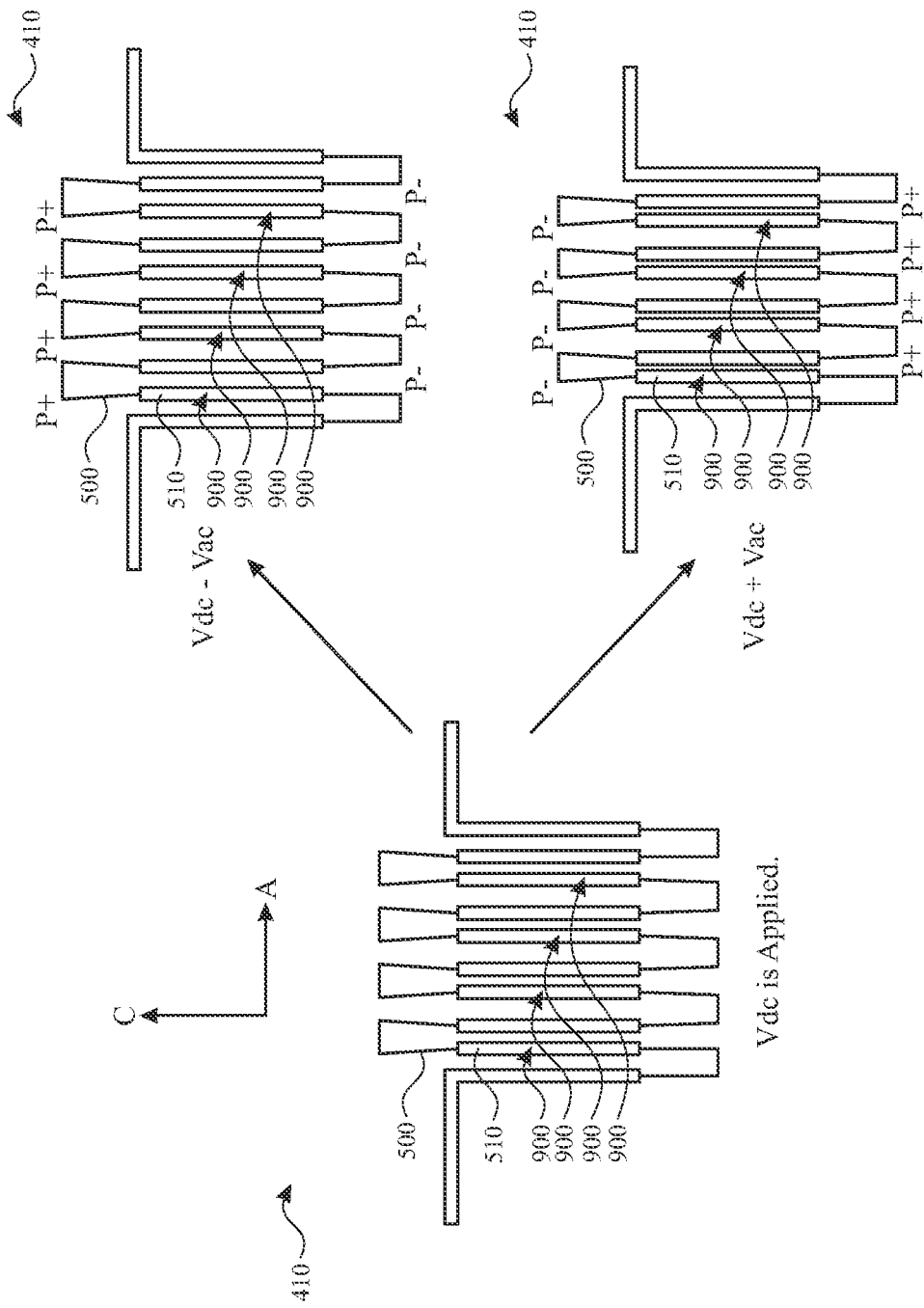
FIG. 9 illustrates cross-sectional side views of an example MEMS structure of a MEMS speaker in various operational states in accordance with various aspects of the subject technology.

FIG. 9 illustrates cross-sectional views of the MEMS structure 410 of FIG. 8, with various operating voltages applied. As shown in FIG. 9, a DC voltage (e.g., Vdc) can be applied to MEMS structure 410 to move pairs 900 of adjacent MEMS electrodes 510 to a predetermined distance apart. As shown, the folds 500 between the electrodes may bend, flex, buckle, or otherwise deform (e.g., inward or outward) to allow the MEMS electrodes 510 to move to the desired spacing responsive to the DC voltage.

An alternating voltage (e.g., alternating between +Vac and −Vac) can be added to the DC voltage, Vdc, to cause the pairs of adjacent MEMS electrodes to move away from and toward each other. As indicated in FIG. 9, when the pairs 900 of MEMS electrodes 510 are moved apart from the DC spacing (e.g., by a reduced voltage Vdc−Vac), a positive pressure (e.g., P+) may be generated above the MEMS structure (e.g., in the front volume 219 and/or in a space 699), and a negative pressure (e.g., P−) may be generated below the MEMS structure (e.g., in the back volume 217 and/or in a neighboring space 699). When the pairs 900 of MEMS electrodes 510 are moved together from the DC spacing (e.g., by an increased voltage Vdc+Vac), a positive pressure (e.g., P+) may be generated below the MEMS structure (e.g., in the back volume 217 and/or in a neighboring space 699), and a negative pressure (e.g., P−) may be generated above the MEMS structure (e.g., in the front volume 219 and/or in a space 699). The pressure changes above and below the MEMS structure as shown can push (e.g., when the pressure is P+) and pull (e.g., when the pressure is P−) air into and out of a speaker housing and/or into and out of the spaces 699 between MEMS structures (e.g., in implementations that include two substrates with openings therein). The pressure differentials and the movement of air cause the generation of sound. The voltage Vac can be varied regularly and/or irregularly to generate desired frequencies of sound with MEMS component 204.

The example of FIG. 9 illustrates an actuation that consists of electrode pairs/unit actuators moving out of phase to generate a pressure gradient, in a first mode of operation corresponding to a breathing mode for MEMS structure 410. It should also be appreciated that other operating modes (e.g., an out-of-plane mode and/or a mixed mode) are possible for MEMS structure 410, depending on boundary conditions at the ends and/or edges of MEMS structure 410.

For example, FIG. 10 illustrates an out-of-plane mode of operation for a MEMS structure 410 in which bulk portions (e.g., groups of corrugations or all of the corrugations) of the MEMS structure 410 move between an in-plane state 1000 and an out-of-plane state 1002 (e.g., including motion along the C dimension defined by the MEMS electrodes 510 in the in-plane state 1000). A mixed mode operation of MEMS structure 410 can be performed using a linear superposition of both breathing mode operations (e.g., as described above in connection with FIG. 9) and out-of-plane mode operations (e.g., as illustrated in FIG. 10). Various boundary conditions for the ends and/or edges of MEMS structure 410 are described in further detail hereinafter, in connection with, for example, FIGS. 15-17.

Prior to the discussion of boundary conditions below, it should be appreciated that the arrangement of folds 500 shown in FIGS. 8 and 9 is merely illustrative, and other arrangements can be used in one or more implementations. For example, FIGS. 11 and 12 illustrate a portion of a MEMS structure 410 in implementations in which the folds 500 have different thicknesses. In the example of FIG. 11, folds 500 are arranged as in FIGS. 8 and 9. In the example of FIG. 12, the folds 500 are implemented as thinned folds 1200, illustrating that the thickness of the folds 500 can be tuned to control the resilience of the corrugations to deformations caused by applied voltages. Thinned folds 1200 may have a thickness that is sufficiently small to allow the thinned folds 1200 to buckle when deformed by an applied voltage.

FIG. 13 illustrates a portion of a MEMS structure 410 in an implementation in which folds 500 are implemented as corrugated folds 1300. Corrugated folds 1300 may allow the folds 500 to provide spring-like motions at the ends of the folds, with the spring-like (corrugated) portions of the fold coupled to MEMS electrodes 510 by rigid portions 1302 of the folds. FIG. 14 illustrates a portion of a MEMS structure 410 in an implementation in which folds 500 are implemented as tented folds. As shown in FIG. 14, tented folds may be formed by linear rigid portions 1400 of MEMS structure 410, the linear rigid portions 1400 meeting at a compliant apex 1402. The implementations illustrated in FIGS. 12-14 may help increase compliance of the folds and the available displacement of MEMS electrodes 510.

Figure 16:
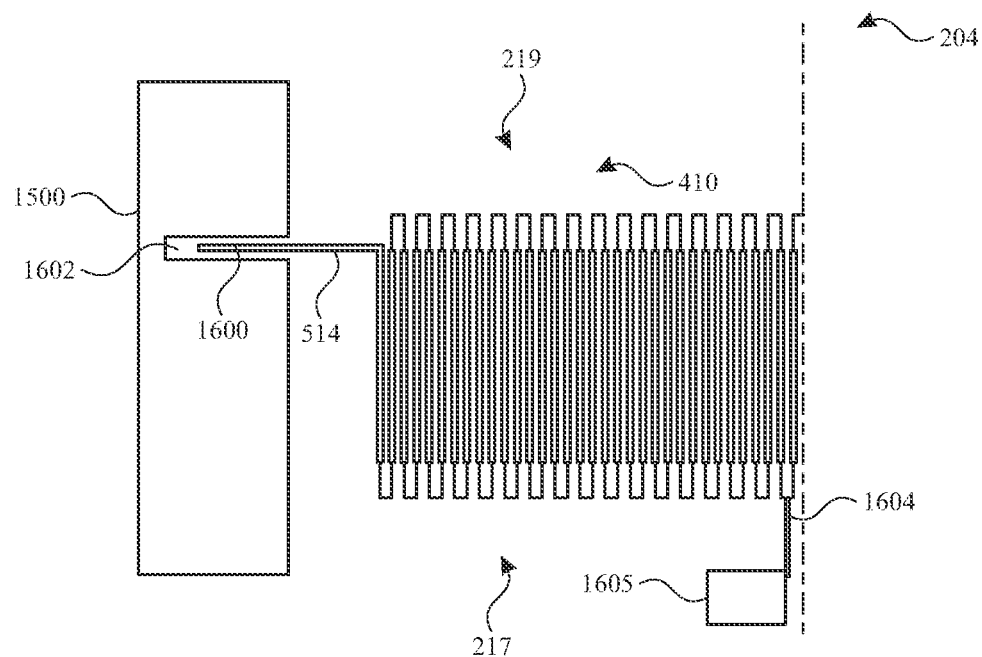
FIG. 16 illustrates a cross-sectional side view of a portion of a MEMS speaker having a MEMS structure with a floating edge in accordance with various aspects of the subject technology.
Figure 17:
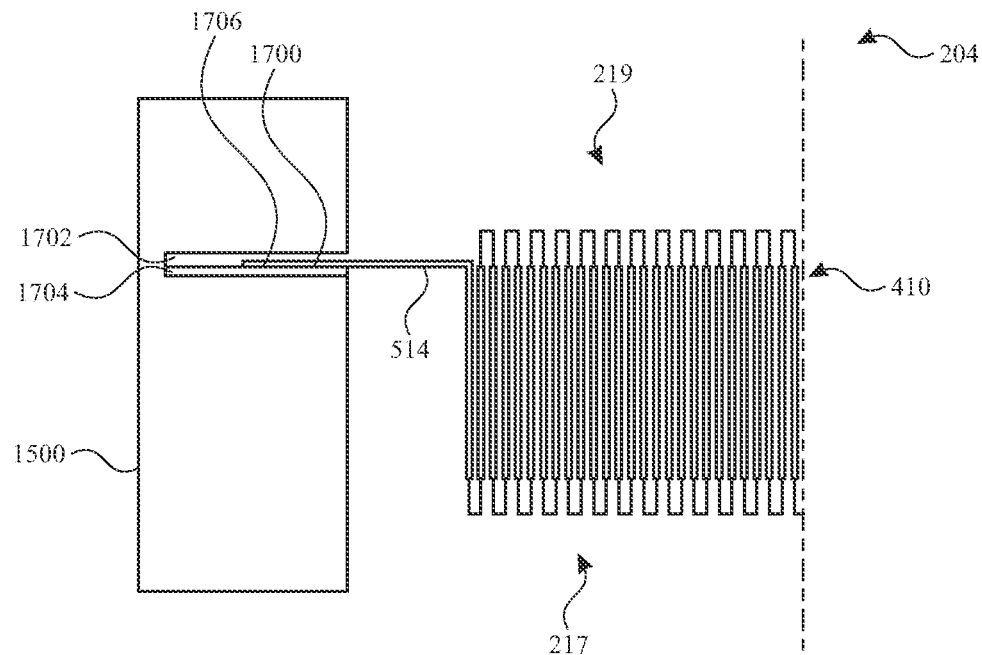
FIG. 17 illustrates a cross-sectional side view of a portion of a MEMS speaker having a MEMS structure with a sliding edge in accordance with various aspects of the subject technology.

As described above in connection with, for example, FIGS. 8-10, various boundary conditions for MEMS structures 410 can be provided, in various implementations, to arrange the MEMS structure 410 for various modes of operation and/or movement. FIGS. 15, 16, and 17 illustrate various examples of boundary conditions for MEMS structures 410 that can each be used in one or more implementations.

In the example of FIG. 15, the edges (e.g., first edge 502 and second edge 504 of FIG. 5) of the MEMS structure 410 are fixed. In the example of FIG. 15, the tabs 514 of MEMS structure 410 are fixed to a corresponding resilient connector (e.g., a resilient connector 1502) that can flex to provide limited movement to the ends of the MEMS structure. In this example, the resilient connector 1502 extends between portions of a rigid connector structure 1500 of MEMS component 204. Fixing the tab(s) 514 to resilient connector(s) 1502 can provide acoustic sealing and compliance to the structure. In one or more implementations, the rigid connector structure 1500 may be an edge structure that runs along an edge of MEMS component 204 and MEMS structure 410 to support the MEMS structure. In implementations in which MEMS component 204 is provided with a first substrate 400 and a second substrate 404 (e.g., as in the example of FIG. 6), rigid connector structure 1500 may form a contiguous portion of a monolithic structure that forms a first substrate 400 and second substrate 404, or may be a separate structure that is attached to the first substrate 400 and the second substrate 404.

FIGS. 16 and 17 illustrate implementations of MEMS component 204 in which the MEMS structure 410 is provided with floating edges 502 and 504. In these implementations, the available displacement of MEMS structure 410, responsive to applied voltages, can be increased relative to a fixed edge implementation. In the example of FIG. 16, a portion 1600 of tab 514 is disposed in a recess 1602 in the rigid connector structure 1500. In this example, one or more posts such as post 1604 can be provided that extend between a fold 500 of MEMS structure 410 and support structure 1605. Support structure 1605 may be mounted to a portion of a speaker housing, may be formed by an integral portion of a speaker housing, or may be formed from a portion of a first substrate 400 and/or a second substrate 404 (e.g., in implementations in which first and second substrates are provided). In the example of FIG. 16, a single post 1604 extends to the support structure 1605 as a central beam at a symmetry axis of the MEMS structure. In other implementations, one or more additional posts 1604 can be provided as anchor beams at selected locations. Recess 1602 may extend along the entire length of MEMS structure 410 (e.g., such that the portions 1600 extend along the entire tab 514) or portions 1600 of tabs 514 may be extensions that extend into separate recesses 1602 disposed along the edge of MEMS structure 410. In the example of FIG. 16, MEMS component 204 is provided with at least one anchor beam (e.g., post 1604) that extends from one of the plurality of alternating folds 500 to the support structure 1605. However, it should be appreciated that two, or more than two anchor beams (e.g., posts 1604) can be provided extending from MEMS structure 410 to the one, two, or more than two support structures. For example, in one or more implementations, two or more attachment regions can be provided for runners and stabilization. In the example of FIG. 16, the recess 1602 may act as an air roller for portion 1600 of tab 514, and can also provide an acoustic seal (e.g., due to high acoustic resistance in the narrow recess).

FIG. 17 illustrates another implementation of a floating edge for MEMS structure 410 in which a portion 1700 of tab 514 rests on a low friction film 1704 within a recess 1702 in rigid connector structure 1500. In this example, the interface 1706 between low friction film 1704 and portion 1700 of tab 514 is a low friction interface that allows the tab to slide within the recess 1702. In this example, the MEMS structure 410 is provided without posts that act as anchor beams. However, in one or more implementations, one or more posts 1604 can also be provided in the sliding edge implementation of FIG. 17.

In the examples of FIGS. 15-17, fixed and floating edges of a MEMS structure 410 are described. It should also be appreciated that ends 506 and 508 (see FIG. 5) can also be fixed and/or floating ends. Fixed ends 506 and/or 508 can be provided by fixing discrete points on the ends of MEMS structure 410 to a connector structure such as a portion of connector structure 1500 that extends along the edges of MEMS structure 410, to a substrate mounted adjacent to the MEMS structure, and/or by fixing the entire end of the MEMS structure 410 to the connector structure or the substrate. Fixed edges may be provided for MEMS structure 410 by fixing the tabs 514 at the edges of the MEMS structure to a support structure for MEMS component 204 (e.g., as shown in the example of FIG. 15). In various implementations, MEMS structure 410 can be mounted in a free-free configuration in which the edges and ends of the MEMS structure are floating edges and ends, a free-fixed configuration in which the edges of the MEMS structure are floating edges and the ends of the MEMS structure are fixed ends, a fixed-free configuration in which the edges of the MEMS structure are fixed edges and the ends of the MEMS structure are floating ends, or a fixed-fixed configuration in which the edges and the ends of the MEMS structure are at least partially fixed. For example, in one or more implementations of the MEMS structure 410, the MEMS structure 410 is formed from a single contiguous structure that extends, in a third dimension (e.g., the B dimension shown in FIG. 5) perpendicular to the first dimension (e.g., the A dimension) and the second dimension (e.g., the C dimension), from a first end 506 to second end 508, and at least one of the first end or the second end is fixed. As another example, in one or more implementations, the MEMS structure 410 is formed from a single contiguous structure that extends, in a third dimension (e.g., the B dimension shown in FIG. 5) perpendicular to the first dimension (e.g., the A dimension) and the second dimension (e.g., the C dimension), from a first end 506 to second end 508, and the first end 506 and the second end 508 are floating ends.

As described above in connection with, for example, FIGS. 8 and 9, the alternating folds 500 and the MEMS electrodes 510 may be densely packed along the first dimension of the MEMS structure (e.g., the A dimension) when no voltage is applied to the corrugated MEMS structure, with a spacing that allows the adjacent MEMS electrodes 510 to be operated in pairs 900. However, in one or more implementations, a MEMS structure 410 may be provided in which some or all of the MEMS electrodes are widely spaced (e.g., to increase the low frequency range of the MEMS speaker).

Figure 18:
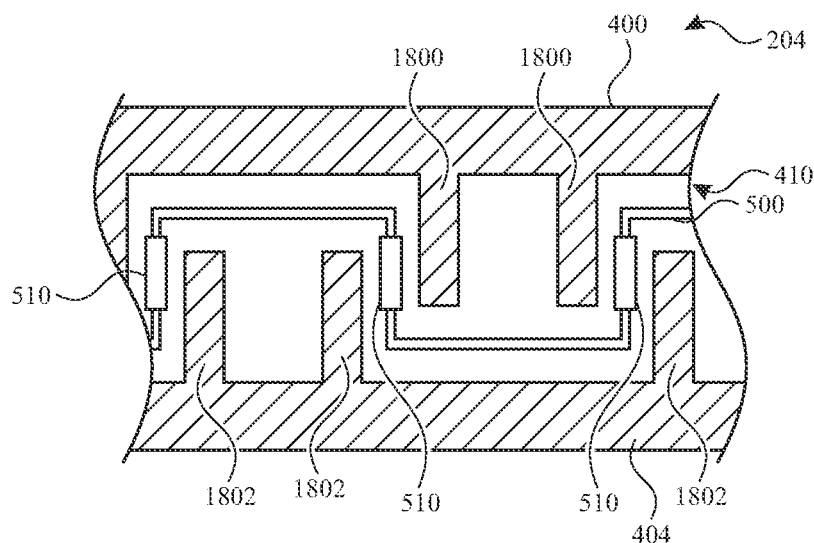
FIG. 18 illustrates a cross-sectional side view of a portion of a MEMS speaker having fixed electrodes in accordance with various aspects of the subject technology.

FIG. 18 illustrates an implementation in which the MEMS electrodes 510 of MEMS structure 410 include widely spaced electrodes that operate as part of a set of electrodes that includes a fixed electrode extending from one of a first substrate such as the first substrate 400 or a second substrate such as the second substrate 404. As shown in FIG. 18, MEMS component 204 may include one or more posts extending from at least one of the first substrate or the second substrate in a direction parallel to the second dimension (e.g., the C dimension) of the MEMS structure 410. In the example of FIG. 18, MEMS component 204 includes posts 1800 extending from the first substrate 400 in the direction of the second substrate 404, and posts 1802 extending from the second substrate 404 in the direction of the first substrate 400 (e.g., in a direction parallel to the second dimension of the MEMS structure 410). In this example, each of the widely spaced MEMS electrodes 510 can be operated in cooperation with a pair of posts 1800 and 1802 to actuate the MEMS electrodes 510. As shown, each of the posts 1800 and 1802 extends from a corresponding substrate on a corresponding side of the MEMS structure 410 in the direction of the other substrate, without passing through the MEMS structure or reaching the other substrate.

As described above in connection with, for example, FIGS. 8 and 9, the alternating folds 500 and the MEMS electrodes 510 (e.g., the corrugations) of MEMS structure 410 may be evenly spaced apart along the first dimension of the MEMS structure (e.g., the A dimension) when no voltage is applied to the corrugated MEMS structure. However, in one or more other implementations, the folds 500 and the MEMS electrodes 510 may be unevenly spaced apart along the first dimension when no voltage is applied to the corrugated MEMS structure.

Figure 19:
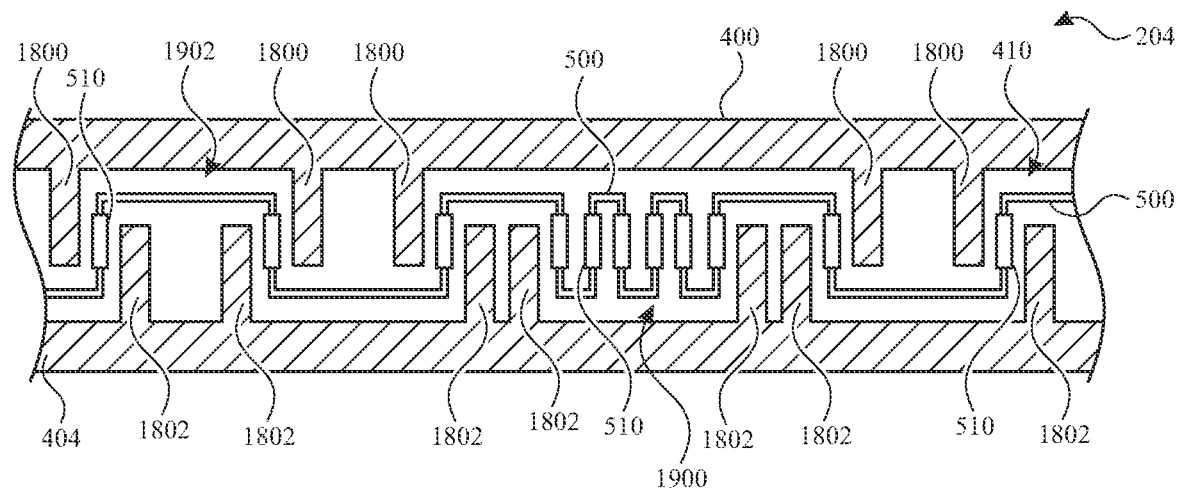
FIG. 19 illustrates a cross-sectional side view of a portion of a MEMS speaker having a MEMS structure with variable electrode spacing in accordance with various aspects of the subject technology.

FIG. 19 illustrates a MEMS component 204 in an implementation in which a MEMS structure 410 includes MEMS electrodes 510 that are unevenly spaced apart along the first dimension when no voltage is applied to the corrugated MEMS structure. As shown in FIG. 19, a MEMS structure 410 may have one or more high frequency portions 1900 in which MEMS electrodes 510 are closely spaced for operation in pairs of MEMS electrodes (e.g., as described above in connection with FIG. 9), and one or more low frequency portions 1902 in which MEMS electrodes 510 are widely spaced for operation in cooperation with fixed electrodes formed from posts 1800 and/or 1802 (e.g., as described above in connection with FIG. 18). As shown, each MEMS electrode 510 in the low frequency portions 1902 may be disposed between a post 1800 extending from first substrate such as first substrate 400 and a second post extending from a second substrate such as second substrate 404. As illustrated in FIGS. 18 and 19, each of the posts 1800 and 1802 may form a fixed electrode positioned adjacent at least a corresponding one of the plurality of MEMS electrodes 510. For example, each MEMS electrode 510 may be actuated by a pair of fixed electrodes formed from a post 1800 and a post 1802.

Figure 20:
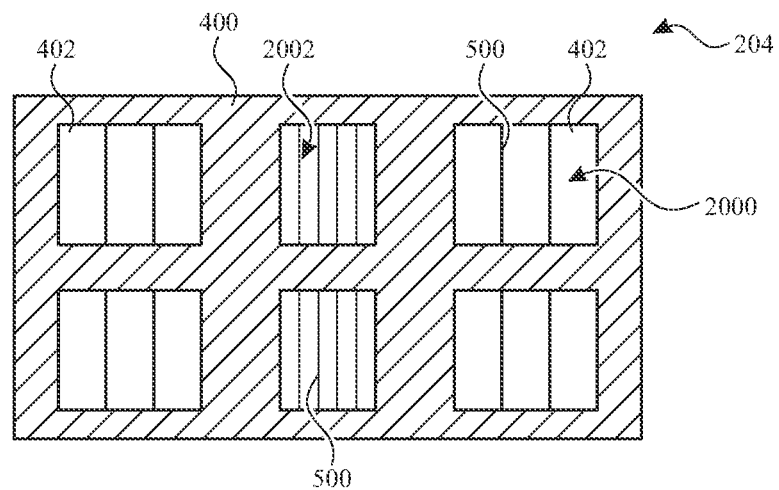
FIG. 20 illustrates top view of a portion of a MEMS speaker having variable electrode spacing in accordance with various aspects of the subject technology.

FIG. 20 illustrates a top view of a MEMS component 204 implemented with varied spacing of the MEMS electrodes 510. In the example of FIG. 20, high frequency regions 2002 (e.g., having closed spaced electrodes such as in high frequency portions 1900 of FIG. 19) are visible through some openings 402, and low frequency regions 2000 (e.g., having widely spaced electrodes such as in low frequency portions 1902 of FIG. 19) are visible through other openings 402. In one or more implementations, the high frequency regions 2002 and low frequency regions 2000 can be implemented using the MEMS structure 410 and posts 1800 and 1802 of FIG. 19, and/or using multiple separate MEMS structures 410, each with even electrode spacings (e.g., one or more MEMS structure 410 as shown in FIG. 8 and one or more MEMS structures as shown in FIG. 18).

Figure 21:
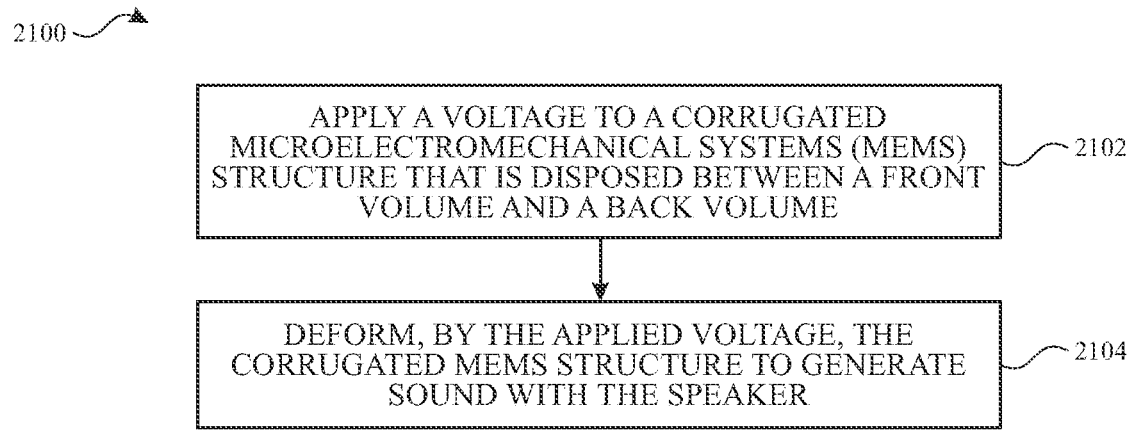
FIG. 21 illustrates a flow diagram of an example process for operating a MEMS speaker in accordance with one or more implementations.

FIG. 21 illustrates a flow diagram of an example process for operating a MEMS speaker in accordance with one or more implementations. For explanatory purposes, the process 2100 is primarily described herein with reference to the device 100 of FIG. 1 or the device 300 of FIG. 3. However, the process 2100 is not limited to device 100 of FIG. 1 or the device 300 of FIG. 3, and one or more blocks (or operations) of the process 2100 may be performed by one or more other components and other suitable devices (e.g., any electronic device including a MEMS speaker as described herein). Further for explanatory purposes, the blocks of the process 2100 are described herein as occurring in serial, or linearly. However, multiple blocks of the process 2100 may occur in parallel. In addition, the blocks of the process 2100 need not be performed in the order shown and/or one or more blocks of the process 2100 need not be performed and/or can be replaced by other operations.

At block 2102, a voltage may be applied to a corrugated microelectromechanical systems (MEMS) structure (e.g., a MEMS structure 410 as described herein) that is disposed between a front volume such as front volume 219 and a back volume such as back volume 217. In some examples, the MEMS structure may be disposed between a first substrate (e.g., first substrate 400) having first openings (e.g., a first plurality of openings 402) and a second substrate (e.g., substrate 404) having second openings (e.g., a second plurality of openings 406) that are misaligned with the first openings. In other examples, the MEMS structure may be openly exposed to the front and/or back volumes.

At block 2104, the corrugated MEMS structure may be deformed, by the applied voltage, to generate sound with the speaker. In one or more implementations, the corrugated MEMS structure is formed by a single contiguous structure that extends, in a first dimension (e.g., the A dimension of FIG. 5), from a first edge (e.g., first edge 502) to a second edge (e.g., second edge 504), and includes one or more alternating folds 500 disposed between the first edge and the second edge. The corrugated MEMS structure may include one or more MEMS electrodes 510, each forming a part of the single contiguous structure, the part extending in a second dimension (e.g., the C dimension of FIG. 5) perpendicular to the first dimension, between a corresponding pair of the alternating folds 500. Deforming the corrugated MEMS structure may cause pressure differentials to be generated in the front and back volumes to generate the sound. In some examples, the pressure differential may be formed in spaces 699 between MEMS structures that are disposed between first and second substrates, the pressure differentials causing air to move through first openings in the first substrate and second openings in the second substrate to generate the sound.

Deforming the corrugated MEMS structure may generate a first pressure in the front volume and a second pressure in the back volume, the first pressure being different than the second pressure to generate the sound (e.g., and/or to cause the air to move). In some examples, deforming the corrugated MEMS structure may generate a first pressure in a first set of spaces 699 between the corrugated MEMS structures and a second pressure in a set of neighboring spaces 699 between the corrugated MEMS structures, the first pressure being different than the second pressure to cause the air to move. Deforming the corrugated MEMS structure may include causing pairs of the MEMS electrodes 510 to move toward or away from each other along the first dimension (e.g., as described above in connection with FIG. 9). Deforming the corrugated MEMS structure may also, or alternatively, include deforming the single contiguous structure in a direction that is parallel to the second dimension (e.g., in an out-of-plane mode of operation as described above in connection with FIG. 10). In one or more implementations, the direction that is parallel to the second dimension extends along a surface of the second substrate (e.g., as described above in connection with FIG. 6).

Figure 22:
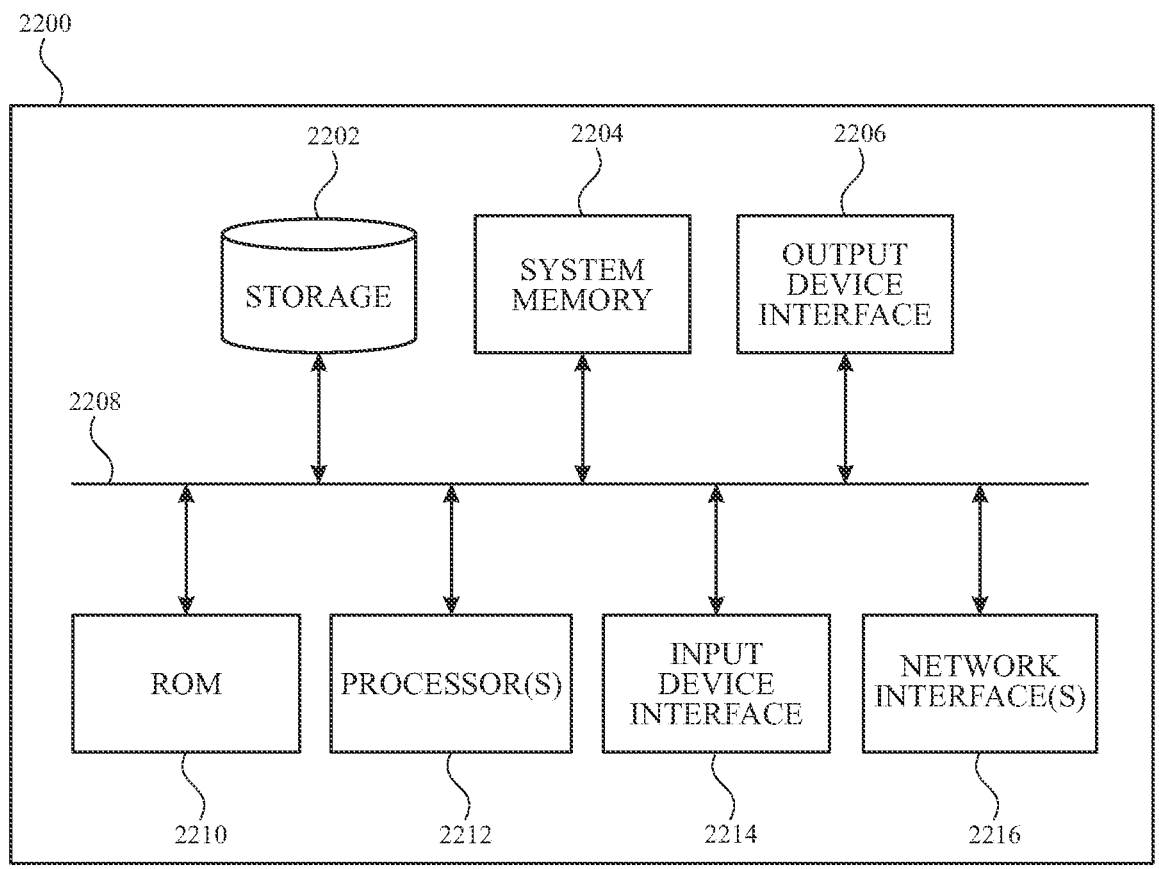
FIG. 22 illustrates an electronic system with which one or more implementations of the subject technology may be implemented.

FIG. 22 illustrates an electronic system 2200 with which one or more implementations of the subject technology may be implemented. The electronic system 2200 can be, and/or can be a part of, one or more of the devices 100 or 300 shown in FIG. 1. The electronic system 2200 may include various types of computer readable media and interfaces for various other types of computer readable media. The electronic system 2200 includes a bus 2208, one or more processing unit(s) 2212, a system memory 2204 (and/or buffer), a ROM 2210, a permanent storage device 2202, an input device interface 2214, an output device interface 2206, and one or more network interfaces 2216, or subsets and variations thereof.

The bus 2208 collectively represents all system, peripheral, and chipset buses that communicatively connect the numerous internal devices of the electronic system 2200. In one or more implementations, the bus 2208 communicatively connects the one or more processing unit(s) 2212 with the ROM 2210, the system memory 2204, and the permanent storage device 2202. From these various memory units, the one or more processing unit(s) 2212 retrieves instructions to execute and data to process in order to execute the processes of the subject disclosure. The one or more processing unit(s) 2212 can be a single processor or a multi-core processor in different implementations.

The ROM 2210 stores static data and instructions that are needed by the one or more processing unit(s) 2212 and other modules of the electronic system 2200. The permanent storage device 2202, on the other hand, may be a read-and-write memory device. The permanent storage device 2202 may be a non-volatile memory unit that stores instructions and data even when the electronic system 2200 is off. In one or more implementations, a mass-storage device (such as a magnetic or optical disk and its corresponding disk drive) may be used as the permanent storage device 2202.

In one or more implementations, a removable storage device (such as a floppy disk, flash drive, and its corresponding disk drive) may be used as the permanent storage device 2202. Like the permanent storage device 2202, the system memory 2204 may be a read-and-write memory device. However, unlike the permanent storage device 2202, the system memory 2204 may be a volatile read-and-write memory, such as random access memory. The system memory 2204 may store any of the instructions and data that one or more processing unit(s) 2212 may need at runtime. In one or more implementations, the processes of the subject disclosure are stored in the system memory 2204, the permanent storage device 2202, and/or the ROM 2210. From these various memory units, the one or more processing unit(s) 2212 retrieves instructions to execute and data to process in order to execute the processes of one or more implementations.

The bus 2208 also connects to the input and output device interfaces 2214 and 2206. The input device interface 2214 enables a user to communicate information and select commands to the electronic system 2200. Input devices that may be used with the input device interface 2214 may include, for example, alphanumeric keyboards and pointing devices (also called "cursor control devices"). The output device interface 2206 may enable, for example, the display of images generated by electronic system 2200. Output devices that may be used with the output device interface 2206 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 22, the bus 2208 also couples the electronic system 2200 to one or more networks and/or to one or more network nodes through the one or more network interface(s) 2216. In this manner, the electronic system 2200 can be a part of a network of computers (such as a LAN, a wide area network ("WAN"), or an Intranet, or a network of networks, such as the Internet. Any or all components of the electronic system 2200 can be used in conjunction with the subject disclosure.

In accordance with some aspects of the subject disclosure, a speaker is provided that includes a front volume; a back volume; and a corrugated microelectromechanical systems (MEMS) structure disposed between the front volume and the back volume.

In accordance with other aspects of the subject disclosure, a method of operating a speaker is provided, the method including applying a voltage to a corrugated microelectromechanical systems (MEMS) structure that is disposed between a front volume and a back volume; and deforming, by the applied voltage, the corrugated MEMS structure to generate sound with the speaker.

In accordance with other aspects of the subject disclosure, an electronic device is provided that includes a speaker, the speaker including a front volume; a back volume; and a corrugated microelectromechanical systems (MEMS) structure disposed between the front volume and the back volume.

In accordance with other aspects of the subject disclosure, a speaker is provided that includes a first substrate having a first plurality of openings; a second substrate having a second plurality of openings that are misaligned with the first plurality of openings; and a corrugated microelectromechanical systems (MEMS) structure disposed between the first substrate and the second substrate.

In accordance with other aspects of the subject disclosure, a method of operating a speaker is provided, the method including applying a voltage to a corrugated microelectromechanical systems (MEMS) structure that is disposed between a first substrate having a first plurality of openings and a second substrate having a second plurality of openings that are misaligned with the first plurality of openings; and deforming, by the applied voltage, the corrugated MEMS structure to generate sound with the speaker.

In accordance with other aspects of the subject disclosure, an electronic device is provided that includes a speaker, the speaker including a first substrate having a first plurality of openings; a second substrate having a second plurality of openings that are misaligned with the first plurality of openings; and a corrugated microelectromechanical systems (MEMS) structure disposed between the first substrate and the second substrate.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Various functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A speaker, comprising:
   a front volume;
   a back volume;
   a corrugated microelectromechanical systems (MEMS) structure disposed between the front volume and the back volume, wherein the corrugated MEMS structure comprises a single contiguous structure that extends, in a first dimension, from a first edge to a second edge, and includes a plurality of alternating folds disposed between the first edge and the second edge, wherein the corrugated MEMS structure comprises a plurality of MEMS electrodes, each forming a part of the single contiguous structure, the part extending in a second dimension perpendicular to the first dimension, between a corresponding pair of the plurality of alternating folds;
   a first substrate disposed on a first side of the corrugated MEMS structure and having a first plurality of openings; and
   a second substrate disposed on a second side of the corrugated MEMS structure and having a second plurality of openings that are misaligned with the first plurality of openings,
   wherein the corrugated MEMS structure is disposed between the first substrate and the second substrate, and the first substrate and the second substrate are spaced apart along a third dimension perpendicular to the first dimension and the second dimension.

2. The speaker of claim 1, wherein first edge and second edge are fixed.

3. The speaker of claim 2, wherein the first edge and the second edge are each fixed to a corresponding resilient connector.

4. The speaker of claim 1, wherein the first edge and the second edge are floating edges.

5. The speaker of claim 4, further comprising at least one anchor beam that extends from one of the plurality of alternating folds to a support structure.

6. The speaker of claim 1, wherein the single contiguous structure extends, in a third dimension perpendicular to the first dimension and the second dimension, from a first end to second end, and wherein at least one of the first end or the second end is fixed.

7. The speaker of claim 1, wherein the single contiguous structure extends, in a third dimension perpendicular to the first dimension and the second dimension, from a first end to second end, and wherein at the first end and the second end are floating ends.

8. The speaker of claim 1, further comprising a plurality of additional corrugated MEMS structures disposed between the first substrate and the second substrate.

9. The speaker of claim 8, wherein the corrugated MEMS structure and the plurality of additional corrugated MEMS structures are misaligned with both the first plurality of openings and the second plurality of openings.

10. The speaker of claim 9, wherein the corrugated MEMS structure and the plurality of additional corrugated MEMS structures are spaced apart in a direction parallel to the second dimension.

11. The speaker of claim 1, wherein the plurality of alternating folds and the plurality of MEMS electrodes are evenly spaced apart along the first dimension when no voltage is applied to the corrugated MEMS structure.

12. The speaker of claim 11, wherein the plurality of alternating folds and the plurality of MEMS electrodes are unevenly spaced apart along the first dimension when no voltage is applied to the corrugated MEMS structure.

13. The speaker of claim 12, further comprising a plurality of posts extending, in a direction parallel to the second dimension, from at least one of a first substrate disposed on a first side of the corrugated mems structure or a second substrate disposed on a second side of the corrugated MEMS structure.

14. The speaker of claim 13, wherein each of the posts comprises a fixed electrode positioned adjacent at least a corresponding one of the plurality of MEMS electrodes.

15. The speaker of claim 1, wherein each of the alternating folds comprises a thinned fold.

16. The speaker of claim 1, wherein each of the alternating folds comprises a corrugated fold.

17. The speaker of claim 1, wherein each of the alternating folds comprises a tented fold.

18. The speaker of claim 1, further comprising:
a third substrate disposed between the first substrate and the second substrate, wherein the corrugated MEMS structure is disposed between the first substrate and the third substrate; and an additional corrugated MEMS structure disposed between the third substrate and the second substrate.

19. A method of operating a speaker, the method comprising:
applying a voltage to a corrugated microelectromechanical systems (MEMS) structure that is disposed between a front volume and a back volume; and
deforming, by the applied voltage, the corrugated MEMS structure to generate sound with the speaker, wherein the corrugated MEMS structure comprises a single contiguous structure that extends, in a first dimension, from a first edge to a second edge, and includes a plurality of alternating folds disposed between the first edge and the second edge, wherein the corrugated MEMS structure comprises a plurality of MEMS electrodes, each forming a part of the single contiguous structure, the part extending in a second dimension perpendicular to the first dimension between a corresponding pair of the plurality of alternating folds, wherein a first one of the plurality of MEMS electrodes has a first cross-sectional thickness, and wherein each of the corresponding pair of the plurality of alternating folds has a second cross-sectional thickness that is less than the first cross-sectional thickness.

20. The method of claim 19, wherein deforming the corrugated MEMS structure generates pressure differentials in the front volume and the back volume to generate the sound.

21. The method of claim 20, wherein deforming the corrugated MEMS structure to generate the pressure differentials causes air to move through openings in a substrate disposed adjacent to the corrugated MEMS structure to generate the sound.

22. The method of claim 20, wherein deforming the corrugated MEMS structure comprises causing pairs of the MEMS electrodes to move toward or away from each other along the first dimension.

23. The method of claim 22, wherein deforming the corrugated MEMS structure further comprises deforming the single contiguous structure in a direction that is parallel to the second dimension.

24. The method of claim 20, wherein deforming the corrugated MEMS structure comprises deforming the single contiguous structure in a direction that is parallel to the second dimension.

25. The method of claim 24, wherein the speaker comprises a first substrate disposed on a first side of the corrugated MEMS structure and a second substrate disposed on a second side of the corrugated MEMS structure, and wherein the direction that is parallel to the second dimension extends along a surface of the second substrate.

26. The method of claim 19, wherein deforming the corrugated MEMS structure comprises deforming the plurality of alternating folds, causing the plurality of MEMS electrodes to move toward or away from each other in a breathing motion.

27. The method of claim 19, wherein each of the alternating folds of the corrugated MEMS structure comprises an insulating element that electrically insulates adjacent ones of the plurality of MEMS electrodes from each other.

28. An electronic device, comprising:
a speaker, comprising:
    a front volume;
    a back volume; and
    a corrugated microelectromechanical systems (MEMS) structure disposed between the front volume and the back volume, wherein the corrugated MEMS structure comprises a single contiguous structure that extends, in a first dimension, from a first moveably mounted edge to a second moveably mounted edge, and includes a plurality of alternating folds disposed between the first moveably mounted edge and the second moveably mounted edge.

29. The electronic device of claim 28, wherein the electronic device comprises a smart phone, a wearable device, or an earbud.

30. The electronic device of claim 28, wherein the first moveably mounted edge and the second moveably mounted edge are each fixed to a corresponding resilient connector.

31. The electronic device of claim 28, wherein the first moveably mounted edge and the second moveably mounted edge are floating edges.

32. The electronic device of claim 28, wherein the first moveably mounted edge and the second moveably mounted edge form a part of an acoustic seal between the front volume and the back volume.

* * * * *